Sept. 10, 1968 D. R. CURRAN ET AL 3,401,275
COMPOSITE RESONATOR
Filed April 14, 1966 2 Sheets-Sheet 1

INVENTOR.
DANIEL R. CURRAN
DON A. BERLINCOURT
BY
ATTORNEY

INVENTOR.
DANIEL R. CURRAN
DON A. BERLINCOURT
BY
James A. Pitt
ATTORNEY 3,401,275
COMPOSITE RESONATOR Daniel R. Curran, Cleveland Heights, and Don A. Berlincourt, Chagrin Falls, Ohio, assignors to Clevite Corporation, a corporation of Ohio Filed Apr. 14, 1966, Ser. No. 542,627
18 Claims. (Cl. 310—8.2)

ABSTRACT OF THE DISCLOSURE

A composite resonator structure comprises a substrate having a piezoelectric driving element formed on one surface thereof. The piezoelectric driving element mechanically drives the composite structure in a vibrational mode determined by the polorization or orientation of the driving element material. By sizing the relative thickness of the piezoelectric element and substrate, improved coupling characteristics are achieved when the composite resonator is operated at a harmonic of its fundamental frequency. Reference is made to the claims for a legal definition of the invention.

This invention relates to piezoelectric resonators specifically to an improved resonator for use in high frequency filter circuits.

The typical prior art resonator comprises a wafer of piezoelectric material such as quartz or ceramic material provided with electrodes on opposite surfaces thereof. Upon application of an alternating signal the material between the electrodes is driven electrically in a predetermined vibrational mode, e.g., thickness shear, thickness extensional, etc. depending on the orientation or polarization of the wafer material.

The resonant frequency of the resonator is dependent on the over-all wafer and electrode thickness and increases with decrease in thickness. At high frequencies very thin wafers are required if fundamental modes are to be used.

Because of difficulties in fabricating extremely thin piezoelectric wafers prior art high frequency resonators are typically intermediate frequency resonators operated at an odd harmonic of the fundamental frequency. Even harmonics cannot be used since perfect stress cancellation occurs and the electromechanical coupling is zero. At odd harmonics some coupling exists due to imperfect stress cancellation. Even though the odd harmonic coupling is substantially reduced by partial cancellation, in many instances it is of sufficient magnitude to render the resonator suitable for filter applications. For instance, an AT-cut quartz wafer at its fundamental has a coupling factor of about 0.09. At the 3rd, 5th, 7th and 9th harmonics couplings of 0.03, 0.018, 0.013 and 0.010, respectively, are obtained.

It is an object of the invention to provide a composite resonator structure having particular utility in high frequency applications.

Another object of the present invention is to increase the coupling of a high frequency resonator operated at a harmonic of a fundamental frequency.

Another object of the invention is to proved a composite resonator having a driving region which mass loads the active region of the resonator.

In a preferred embodiment of the invention an electroded piezoelectric driving element is formed on one surface of a substrate of high Q material. The piezoelectric element mechanically drives the composite structure thus formed in a vibrational mode determined by the polarization or orientation of the driving element material. By sizing the relative thicknesses of the piezoelectric element and substrate improved coupling characteristics can be achieved when the composite resonator is operated at a harmonic of its fundamental frequency.

Other objects and advantages will become apparent from the following description taken in connection with the accompanying drawings wherein.

Figure 1:
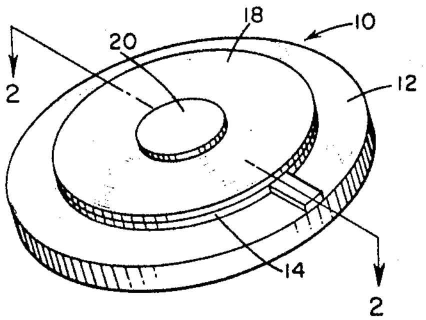
FIGURE 1 is a perspective view of a composite resonator in accordance with the invention.
Figure 2:
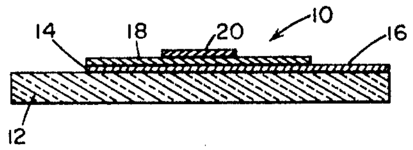
FIGURE 2 is a section taken along the line 2—2 of FIGURE 1.

Referring to FIGURES 1 and 2 of the drawings there is shown a resonator in accordance with the invention identified generally by the reference numeral 10. The resonator 10 in general comprises a wafer substrate 12 having a circular electrode 14 suitably formed on the upper major surface thereof defining an integral lead portion 16 extending to the wafer edge to facilitate connection of the resonator 10 in an electrical circuit. A piezoelelectric driving element or layer 18 of circular configuration is suitably formed on the upper major surface of the wafer 12 to cover the electrode 14 as shown in FIGURE 2. A second smaller diameter circular electrode 20 is formed on the upper surface of the element 18 in coaxial relationship with the electrode 14 to complete the composite resonator structure. It will be apparent to those skilled in the art that the electrodes 14 and 20 and piezoelectric element 18 may be of non-circular configuration and that the specific configurations disclosed are for purposes of illustration and not limitation.

The wafer substrate 12 is preferably formed from a material having a high mechanical Q and as will later be described in more detail a frequency temperature coefficient of magnitude and polarity such as to cancel the frequency temperature coefficient of the piezoelectric driving element 18. Suitable materials for the substrate 12 are AT-cut quartz and metallic compositions such as Invar and Elinvar. Because of its high Q and low frequency temperature coefficient AT-cut quartz is the preferred substrate material and the description will be directed thereto.

The electrodes 14 and 20 are most conveniently formed by vapor deposition of electrically conductive materials such as gold on chromium or aluminum by one of numerous techniques known in the prior art. Alternatively the electrodes 14 and 20 may be directly applied to the piezoelectric element 18 whereupon the latter may be adhered to the surface of the wafer 12 by a suitable epoxy resin.

The piezoelectric driving element 18 may take the form of a separately fabricated disk of piezoelectric material or may be formed by vapor deposition of suitable materials which can be oriented during vapor deposition. In the case of a separately fabricated disk suitable materials include piezoelectric ceramic or monocrystalline materials such as quartz, Rochell Salt, DKT (di-potassum tartrate), lithium sulfate or the like. The monocrystalline materials are preferred for filter applications because of their characteristically high mechanical quality factor $Q_m$. Of the monocrystalline materials "AT-cut" quartz is much preferred because of its temperature stability and very favorable mechanical characteristics.

As is well known to those skilled in the art, the basic vibrational mode of a crystal plate is determined by the orientation of the plate with respect to the crystallographic axes of the crystal from which it is cut. It is known for example that a "0° Z-cut" of DKT or an "AT-cut" of quartz may be used for a thickness shear mode of vibration. In the case where element 18 is separately fabricated an "AT-cut" quartz plate would be preferred, although certain ceramic compositions may also be used for wider bandwidths.

The preferred method of forming driving element 18 is by vapor deposition of a layer of piezoelectric material on the upper surface of wafer 12. As disclosed in copending application Ser. No. 363,369 filed on Apr. 29, 1964, by Lebo R. Shiozawa and assigned to the same assignee as the present invention materials selected from the group consisting of cadium sulfide, cadmium selenide, zinc oxide, beryllium oxide, wurtzite zinc sulfide and solid solutions thereof can be vapor deposited on the surface of a substrate with an orientation such as to produce a thickness extensional mode of vibration. In the publications, "Ultra-High Frequency CdS Transducers," IEEE Transactions on Sonics and Ultrasonics, vol. SU-11, No. 2, pp. 63–68 by N. F. Foster and "Cadmium Sulphide Evaporated-Layer Transducers," Proc. IEEE, vol. 53, No. 10, pp. 1400–1405 (1965) by N. F. Foster, a process for vapor depositing cadmium sulfide with an orientation to produce a thickness shear mode of vibration is disclosed. Such prior art techniques are suitable for the formation of driving element 18 shown in FIGURE 2.

The most preferred combination for the embodiment shown in FIGURES 1 and 2 comprises a driving element 18 formed by the vapor deposition of cadmium sulfide on a substrate 12 of "AT-cut" quartz. The cadmium sulfide driving element is preferably vapor deposited by a process similar to that disclosed in the aforementioned Foster publications with an orientation such as to produce a thickness shear mode of vibration. To achieve optimum temperature stability the "AT-cut" substrate 12 is slightly off-cut so that the quartz material has a slight positive temperature-frequency characteristic which counteracts the larger negative temperature-frequency characteristic of the cadmium sulfide material.

Figure 6:
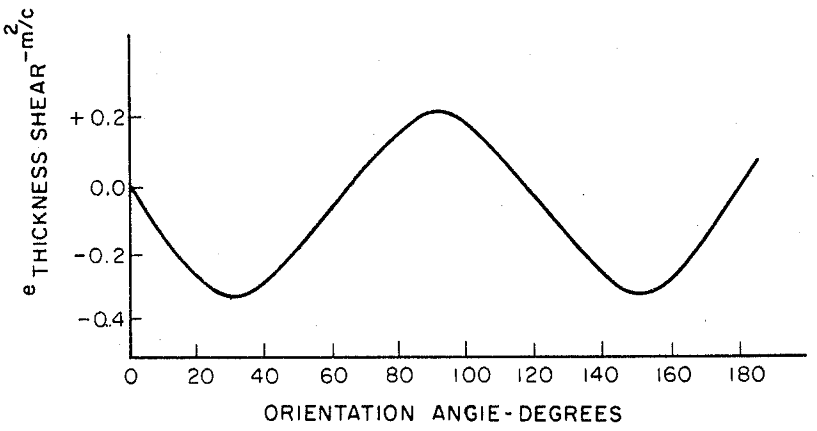
FIGURE 6 is a curve illustrating the variation in shear coupling of a vapor deposited CdS film with orientation angle.

The aforementioned Foster publications disclose that cadmium sulfide vapor deposited with an angle between the molecular beam and the plane of the substrate has a shear response. We have additionally found that the shear response is optimum when the actual angle between the CdS film *c*-axis and the perpendicular to the film surface is between 20 and 40 degrees and maximum at about 30 degrees. In FIGURE 6 of the drawings there is shown a curve of shear response vs. orientation angle illustrating the variation in response from 0 through 180 degrees.

Considering now the relative thickness of the driving element 18 and substrate 12 for a high frequency resonator the over-all total thickness is selected to have a fundamental frequency corresponding to $1/n$ times the frequency at which the resonator 10 is to be operated where $n$ is any integer. Preferably the over-all thickness is equal to an integral number of half wavelengths at the operating frequency and the driving element 18 is between about 0.3 and 0.6 wavelength in thickness.

Figure 4:
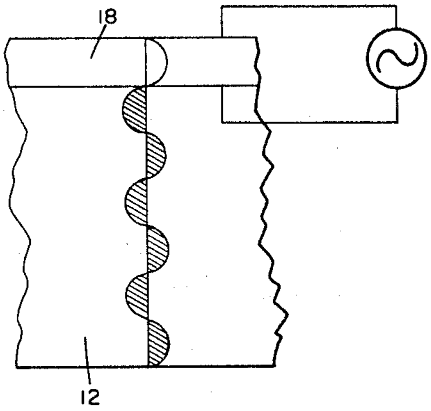

Referring now to FIGURE 4 of the drawings there is illustrated schematically a cross-section of a resonator in accordance with the invention with the electrode omitted having an over-all thickness equal to seven half wavelengths for vibration at the seventh harmonic of a fundamental frequency. Neglecting the electrode thickness which is less than 5 percent of the thickness of element 18 the driving element 18 is provided with a thickness equal to exactly one half wavelength. As will be evident from the stress concentration profile depicted in FIGURE 4 where stress cancellation is indicated by cross-hatching, there is no stress cancellation within the active electrically driven element 18, even though the entire composite resonator is subject to $6/7$ complete stress cancellation.

Figure 3:
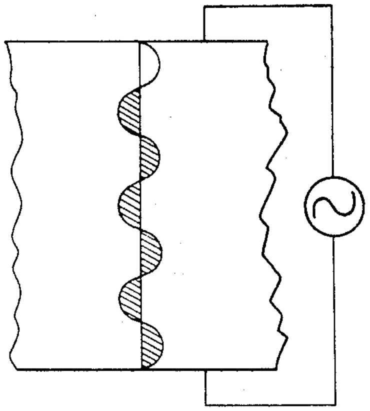
FIGURES 3, 4 and 5 are schematic illustrations showing stress vs. thickness profiles for a prior art resonator and composite resonators in accordance with the invention.

The principal advantage of the invention is the confinement of the driving energy to the active region of the total thickness. This will be more apparent from FIGURE 3 which is a schematic cross section of a typical prior art resonator having a wafer thickness equal to 7 half wavelengths. In this instance driving energy is applied to the entire thickness, and $6/7$ of the driving stress cancels. The situation with the composite resonator of FIGURE 4 is more favorable since the region in which stress cancellation occurs is not electrically driven. It has been found that coupling in the order of .013 can be obtained with a quartz plate such as depicted in FIGURE 3 operated at the 7th harmonic whereas with the composite structure shown in FIGURE 4 with a CdS film oriented optionally a coupling of over 0.07 can be obtained at the same harmonic. The composite resonator structure accordingly is markedly superior to prior art resonator structures in performance.

Figure 5:
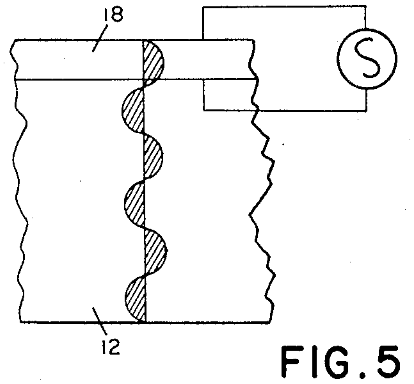

Another feature of the invention is that the composite resonator can be operated at even and odd harmonics of a fundamental frequency. Referring now to FIGURE 5 of the drawings there is shown schematically a cross section of the resonator 10 with the electrodes omitted for clarity having a thickness equal to 6 half wavelengths for operation at the sixth harmonic of a fundamental frequency. The thickness of the driving element 18 is in this instance about $1/7$ of the total thickness or less than one half wavelength. In this case there is less than one half wavelength of the stress profile within the thickness of element 18 and stress cancellation cannot occur within the element thickness. The element 18 is, accordingly, effective to drive the substrate 12 at a frequency equal to the 6th harmonic of the fundamental frequency. In fact, the coupling of the composite resonator of FIGURE 5 will be slightly higher than that of FIGURE 4 due to a slightly more favorable stress profile within the active region.

It will be apparent in connection with FIGURE 5 that if the thickness of driving element 18 were equal to an even number of half wavelengths such as 2, 4, 6, etc., stress cancellation would occur within the thickness of element 18 and the resonator would be inoperative. It is also apparent that an odd number of half wavelengths will not result in complete cancellation and the element will be operative although with lower coupling than with one half wavelength.

A further specific advantage of the invention is the inherent mass loading of the active region of the resonator structure by the driving element 18. In copending application Ser. No. 281,488 filed on May 20, 1963 by William Shockley and Daniel R. Curran and assigned to the same assignee as the present invention there is disclosed theory and structure for achieving mass loading of resonator structures to achieve optimum resonator performance. More specifically, as disclosed in application Ser. No. 281,488 optimum mass loading and performance is achieved when the ratio of the resonant frequencies of the electroded and non-electroded regions is in the range of 0.8 to 0.999, i.e., a value less than one.

Figure 7:
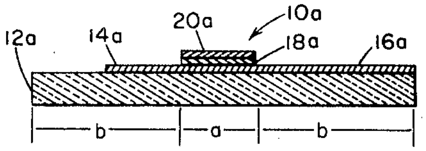
FIGURE 7 is a sectional view similar to FIGURE 2 illustrating a modification thereof.

In FIGURE 7 of the drawings we have illustrated a modification of the composite resonator structure depicted in FIGURE 1 which is particularly suitable for achieving mass loading of the electroded region. Parts in FIGURE 7 corresponding to those in FIGURE 2 have been identified by corresponding reference numerals followed by the suffix *a*. In general the embodiment of FIGURE 7 is identical to that shown in FIGURE 2 except that the driving element **18*a* is the same diameter as electrode 20*a***.

The resonator structure depicted in FIGURE 7 defines an electroded region (*a*) having a resonant frequency $f_a$ determined by the total composite thickness and the densities of the electrode, piezoelectric and substrate materials. The surrounding non-electroded region will have a higher resonant frequency $f_b$ due to its lesser composite thickness. In accordance with the mass loading concept disclosed in copending application Ser. No. 281,488 a ratio $f_a/f_b$ in the range of 0.8 to 0.999 is desired to achieve optimum resonator performance.

With the composite resonator structure shown in FIGURE 7 the effective thickness of the electroded region (*a*) may be conveniently varied relative to the effective thickness of the non-electroded region (*b*) by varying the thickness of driving element 18*a*. In the case of a composite resonator operated at a fundamental frequency the thickness of the element 18*a* and/or associated electrodes may be varied as desired to achieve desired degrees of mass loading. In the case of high frequency resonators operated at a harmonic of a fundamental frequency the element 18*a* and/or associated electrodes may be varied in thickness within the range permitted by the stress cancellation considerations herebefore described to achieve desired mass loading of the electroded region (*a*). The composite structure in accordance with the invention thus has substantial utility in connection with both low and high frequency resonators.

Figure 8:
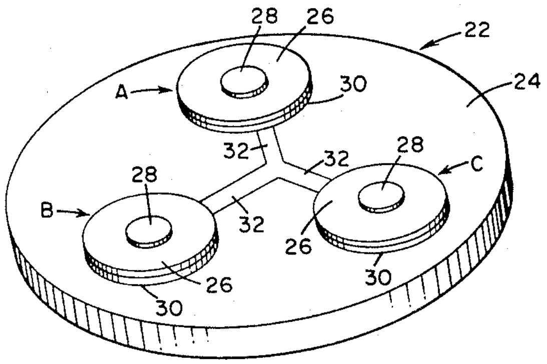
FIGURE 8 is a perspective view of a multi-resonator structure incorporating the invention.

Referring to FIGURE 8 of the drawing there is shown a composite multi-resonator structure in accordance with the invention identified generally by the reference numeral 22. The multi-resonator structure shown is of the same general type disclosed and claimed in U.S. Patent No. 3,222,622 and assigned to the same assignee as the present invention. In accordance with the teaching of said patent the resonators defined are preferably spaced in accordance with the range of action of the individual resonators so that the individual resonator functions independently without interaction.

In accordance with the teaching of the present invention a multi-resonator structure such as disclosed and claimed in the aforementioned patent may comprise a substrate 24 of "AT-cut" quartz. In the embodiment shown 3 spaced piezoelectric driving elements 26 of the configuration shown in FIGURES 1 and 2 are each formed on the surface of the substrate 24 by vapor deposition of cadmium sulfide in the same manner as the element 18 of FIGURES 1 and 2. Similar to the embodiment shown in FIGURES 1 and 2 each driving element 26 is provided with electrodes 28 and 30 by vapor deposition of suitable electrically conductive material. In this instance the bottom electrodes 30 are provided with interconnected vapor deposited leads 32 to connect the bottom electrodes in a predetermined circuit configuration.

Figure 9:
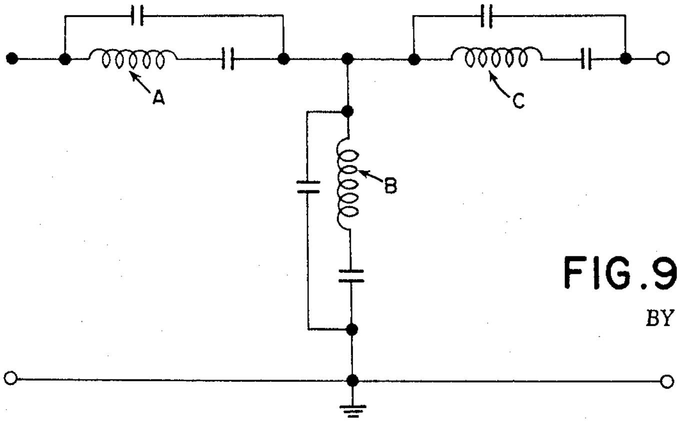
FIGURE 9 is a schematic illustration of an equivalent circuit for the structure depicted in FIGURE 8.

The electrodes and driving elements disclosed in connection with FIGURE 8 coact with the substrate material to define a plurality of piezoelectric resonators A, B and C. With the particular electrical connections shown the filter formed comprises a T section filter having the equivalent circuit illustrated in FIGURE 9 of the drawings. Another embodiment of the multi-resonator structure in FIGURE 8 consists of a substrate with the piezoelectric film covering all or a substantial portion of its surface, and with electrode spots to define the individual resonators. The top and bottom electrodes are essentially concentric and provide loading to achieve the desired ratio $f_a/f_b$. Interconnections are provided as required but with careful attention that the upper and lower interconnections are far out of register. It will be apparent from the disclosure of Patent No. 3,222,622 that any number of electroded driving elements may be variously arranged and interconnected to provide different filter configurations.

To facilitate mass loading of the individual resonators of the multi-resonator structure shown in FIGURE 8 the individual resonators A, B and C may alternatively be constructed as shown in FIGURE 7.

Resonator structures in accordance with the present invention may also incorporate the structural innovations disclosed in copending application Ser. No. 449,063 filed on Apr. 19, 1965, by Daniel R. Curran and Donald J. Koneval; Ser. No. 448,922 filed on Apr. 19, 1965 by Daniel R. Curran and Donald J. Koneval and Ser. No. 448,923 filed on Apr. 19, 1965 by Donald J. Koneval and Daniel R. Curran, all of which are assigned to the same assignee as the present invention. The techniques disclosed in said applications for tuning, suppression of spurious responses, etc., may be variously applied to the compoite structure herein disclosed to achieve desired resonator characteristics at desired frequencies of operation.

While there have been described what at present are believed to be the preferred embodiments of this invention, it will be obvious to those skilled in the art that various changes and modifications may be made therein without departing from the invention, and it is aimed, therefore, to cover in the appended claims all such changes and modifications as fall within the true spirit and scope of the invention.

It is claimed and desired to secure by Letters Patent of the United States:

1. A high frequency resonator comprising: a wafer substrate; a driving element of piezoelectric material on one major surface of said substrate; and electrode means associated with said driving element; said wafer, said driving element and said electrode means forming a composite structure having an over-all thickness defining a resonant frequency corresponding to $1/n$ times the frequency at which the resonator is to be operated where $n$ is any integer.

2. A high frequency resonator comprising: a wafer substrate of predetermined thickness; a driving element comprising a layer of piezoelectric material having a predetermined thickness on one major surface of said substrate; and electrodes associated with opposite planar surfaces of said driving element; said wafer, said driving element and said electrodes defining a composite structure having an over-all thickness equal to an integer number of half wavelengths at the operating frequency of the resonator.

3. A high frequency resonator as claimed in claim 2 wherein the thickness of said driving element is between 0.3 and 0.6 wavelength.

4. A high frequency resonator as claimed in claim 3 whereinthe over-all thickness of said composite structure is between 5 and 20 one half wavelengths at the operating frequency of the resonator.

5. A high frequency resonator as claimed in claim 4 wherein said piezoelectric driving element comprises vapor deposited piezoelcctric material selected from the group consisting of cadmium sulfide, cadmium selenide, zinc oxide, beryllium oxide, wurtzite zinc sulfide and solid solutions thereof.

6. A high frequency resonator as claimed in claim 5 wherein said electrodes comprise deposited layers of electrically conductive material.

7. A high frequency resonator for operation at a harmonic of a fundamental frequency comprising: a wafer substrate of predetermined thickness; an electrode on one surface of said substrate formed by deposition of electrically conductive material; a driving element comprising a layer of piezoelectric material vapor deposited on said electrode; and a second electrode on said driving element formed by vapor or chemical deposition of electrically conductive material on such driving element; said substrate, said driving element and said electrodes defining a composite structure having an over-all thickness equal to an integral number of half wavelengths at the operating frequency of the resonator.

8. A high frequency resonator as claimed in claim 7 wherein said substrate comprises "AT-cut" quartz material.

9. A high frequency resonator as claimed in claim 8 wherein said driving element comprises vapor deposited cadmium sulfide material.

10. A high frequency resonator as claimed in claim 9 wherein said cadmium sulfide material has negative temperature-frequency characteristics and said quartz material is slightly off-cut to have compensating positive temperature-frequency characteristics.

11. A high frequency resonator as claimed in claim 10 wherein said composite structure has a thickness shear mode of vibration.

12. A high frequency resonator as claimed in claim 11 wherein said composite structure has a total thickness between 5 and 20 half wavelengths at the operating frequency and said driving element has a thickness of from 0.3 to 0.6 wavelength.

13. A high frequency multi-resonator structure comprising a wafer substrate; and a plurality of electroded driving elements of piezoelectric material formed on one major surface of said substrate in predetermined spaced relationship to define a plurality of piezoelectric resonators vibratory in a thickness mode of vibration without electromechanical interaction; each of said driving elements defining with the underlying substrate thickness of composite thickness equal to an integral number of half wavelengths at its operating frequency.

14. A high frequency multi-resonator structure as claimed in claim 13 wherein the thickness of each of said driving elements is from 0.3 to 0.6 wavelength.

15. A high frequency multi-resonator structure as claimed in claim 14 wherein said substrate is formed from quartz and said driving elements comprise vapor deposited cadmium sulfide.

16. A composite mass loaded resonator structure comprising: a wafer substrate; a driving element of piezoelectric material on one major surface of said substrate; and electrode means associated with said driving element; the effective composite thickness of said driving element, said electrode means and said substrate defining an electroded region having a resonant frequency $f_a$ corresponding to $1/n$ times the frequency at which the resonator structure is to be operated where $n$ is any integer, said substrate defining a region surrounding said electroded region defining a resonant frequency $f_b$ higher in magnitude than $f_a$; said electroded region having an effective composite thickness that relative to the thickness of said surrounding region whereby $f_a/f_b$ is in the range of 0.8 to 0.99999.

17. A composite mass loaded resonator structure as claimed in claim 16 wherein said piezoelectric driving element comprises vapor deposited piezoelectric material selected from the group consisting of cadmium sulfide, cadmium selenide, zinc oxide, beryllium oxide, wurtzite zinc sulfide and solid solutions thereof.

18. A composite mass loaded resonator structure as claimed in claim 17 wherein said electrode means comprise a first planar electrode interposed between said driving element and said substrate and a second planar electrode on the surface of said driving element.

References Cited

UNITED STATES PATENTS

| | | | |
|---|---|---|---|
| 3,311,760 | 3/1967 | Durgin | 310—8.2 |
| 3,253,166 | 5/1966 | Osial | 310—8.1 |
| 3,222,622 | 12/1965 | Curran | 310—8.1 |

J. D. MILLER, *Primary Examiner.*